United States Patent [19]
Pinkham et al.

[11] Patent Number: 5,781,496
[45] Date of Patent: Jul. 14, 1998

[54] BLOCK WRITE POWER REDUCTION MEMORY WITH REDUCED POWER CONSUMPTION DURING BLOCK WRITE MODE

[75] Inventors: Ray Pinkham, Los Gatos; Cheow F. Yeo, San Jose, both of Calif.

[73] Assignee: Hyundai Electronics America, Inc., San Jose, Calif.

[21] Appl. No.: 864,267

[22] Filed: May 28, 1997

Related U.S. Application Data

[63] Continuation of Ser. No. 649,399, May 17, 1996, abandoned.

[51] Int. Cl.$^6$ .................................................. G11C 8/00
[52] U.S. Cl. ........................... 365/230.03; 365/230.06
[58] Field of Search ..................... 365/230.06, 230.03, 365/230.08

[56] References Cited

U.S. PATENT DOCUMENTS

| | | | |
|---|---|---|---|
| 4,667,313 | 5/1987 | Pinkham et al. | 365/240 |
| 4,879,692 | 11/1989 | Tokushige | 365/222 |
| 4,961,171 | 10/1990 | Pinkham et al. | 365/230 |
| 4,985,643 | 1/1991 | Proebsting | 307/443 |
| 5,506,814 | 4/1996 | Hush et al. | 365/230.03 |
| 5,533,187 | 7/1996 | Priem et al. | 365/230.03 |
| 5,544,105 | 8/1996 | Hirose et al. | 365/189.11 |

OTHER PUBLICATIONS

Pinkham R. et al., "A 128×8 70MHz Multiport video RAM with Auto Register Reload and 8×4 Block Write Feature," *IEEE Journal of Solid–State Circuits*, 23.5:1133–1139 (Oct. 1988).

Samsung Electronics, "256k × 32 CMOS Window RAM Drive KM4232W259A," (Sep. 1993).

Wilson R., "Samsung Opens 'Window' on Dual–Port Video Ram," *Electronic Engineering Times*, Issue No. 772 (Nov. 1993).

*Primary Examiner*—David C. Nelms
*Assistant Examiner*—Michael T. Tran
*Attorney, Agent, or Firm*—Townsend and Townsend and Crew LLP

[57] ABSTRACT

A video memory device has a normal write mode and a block write mode, and includes a global write driver driving global input/output (I/O) lines, and a number of local write drivers, each driving local I/O lines coupled to a number of memory cells. Control circuitry is coupled to the global write driver and to the local write drivers, and is adapted to generate block write control signals and normal write control signals. The block write control signals cause the write data path to freeze during a block write cycle, thereby conserving power during block writes.

36 Claims, 9 Drawing Sheets

BLOCK WRITE POWER REDUCTION MEMORY WITH REDUCED POWER CONSUMPTION DURING BLOCK WRITE MODE

This is a Continuation of application Ser. No. 08/649,399 filed May 17, 1996, now abandoned.

BACKGROUND OF THE INVENTION

The present invention relates to power reduction in memory devices. In particular, the present invention relates to power reduction in memory devices having block write cycles.

It is of continuing importance to reduce power consumption in memory devices. In large capacity memory chips, active power reduction is vital to realizing low-cost, high-reliability chips, as it permits the devices to be implemented in plastic packaging, with low operating currents, and at low junction temperatures. A number of techniques have been used to reduce active power consumption in memory chips such as dynamic random access memories (DRAMs). A common technique is to implement a DRAM using a number of arrays rather than a single block of memory. That is, the DRAM is implemented with multi-divided data lines having shared sense amplifiers, input/output (I/O), and column decoders. Power consumption is minimized by reducing the number of memory cells connected to each data line, thereby reducing the switching capacitance of each line. Other active power reduction schemes have been used, including, for example, reducing the external supply voltage from 5 to 3.3 V, using half-VDD data line precharges and providing on-chip voltage-down conversions which reduce the internal supply voltage VDD.

Each of these techniques may be used in most DRAM architectures to minimize the active power consumed by a device. However, a relatively recent DRAM architecture complicates attempts to minimize power consumption. To improve performance in graphics applications, recent DRAM architectures have included features for performing a multiple column Block Write function as described in U.S. Pat. No. 4,667,313, issued May 19, 1987 to Pinkham et al. Today's graphics systems generally contain a DRAM or Video RAM based frame buffer memory system. For each pixel on a video display, the frame buffer stores a data pattern associated with a given color. In graphics applications it is often desirable to write a single data pattern, representing for example the color red, to many adjacent memory locations (that is, to a number of adjacent pixels on a display). Video RAMs commonly accomplish this using a block write function. A color register inside each DRAM or Video DRAM device holds a color data pattern to be written to multiple, adjacent pixels. During a block write cycle, the contents of the color register is coupled to the write data path and used as the data source for writing to memory. Several adjacent column addresses are selected for the block write operation by overriding the conventional column decode function (which normally selects exactly one column address for writing). A pair of I/O lines, comparable in function to local I/O lines and representing the contents of the color register, are coupled to multiple bit line sense amplifiers and thus to multiple column addresses on a given row. Accordingly, the contents of the color register are written to all selected column address locations. Video RAM and Synchronous Graphics RAM devices having the ability to perform eight column block writes are available today, thus, for the purposes of discussion, an eight column block write device will be described throughout this specification.

While the block write boasts an obvious performance advantage (as much as eight times the bandwidth for a write operation), the electrical current of the device increases dramatically during the block write cycles. In the case where all eight column addresses are written with the contents of the color register, eight times as many bit line sense amplifiers must be over-written and the capacitance of eight times as many bit lines must be charged or discharged in comparison to a conventional, single column write operation. This current is added to the current required to charge and discharge the highly capacitive I/O lines. In many cases, the block write can become the single largest current mode of operation on graphics or video DRAM devices.

A consequence of the larger current level is that associated signal and power lines on the chip must be enlarged to handle the additional current. This results in a larger die size and therefore higher die cost. Also, the larger current value is associated with a larger power dissipation on the chip. As power dissipation increases, the junction temperature of the chip rises. This causes the mobility of transistors on the chip to decrease, leading to a reduction in circuit performance. To bonus back the lost performance, the circuit must be designed to run faster. However, this is generally associated with even higher power dissipation which further increases junction temperature and partially mitigates the effort to design for increased performance.

Another memory development further exacerbates the problem of limiting power dissipation—the use of synchronous memories. High performance synchronous graphics DRAMs have extremely short cycle times. Power considerations currently limit their practical use with block write cycles. These synchronous memories generally employ unconditionally precharged, pulsed write paths, where highly capacitive differential data lines are unconditionally precharged on every write or block write cycle, and self-timed pulses are used to propagate signals down the data path to quickly develop a differential signal. An example of a pulsed write path can be found in U.S. Pat. No. 4,985,643, issued Jan. 15, 1991 to Proebsting.

Memories implemented using these techniques, however, dissipate greater amounts of average power than, e.g., static data path implementations. Compared to static data path memories, pulsed I/O schemes draw significantly more power when input data does not change with every cycle (e.g., in block writes).

Accordingly, an approach to reducing the active power consumption caused by block write modes of operation is needed. It is also desireable to provide an approach which may be implemented in synchronous memory systems, or other memory systems in which highly capacitive data lines are first precharged and equilabrated before each write operation.

SUMMARY OF THE INVENTION

According to the invention, a video memory device has a normal write mode and a block write mode, and includes a global write driver driving global input/output (I/O) lines, and a number of local write drivers, each driving local I/O lines coupled to the bit lines of a number of memory cells through a column decode pass gate. Control circuitry is coupled to the global write driver and to the local write drivers, and is adapted to generate block write control signals and normal write control signals. The block write control signals cause the global I/O lines to freeze during a block write cycle, thereby conserving power during block writes.

Once a block write cycle (or cycles) are complete, a reset signal is generated, releasing the global I/O lines and allowing normal operation. The result is the ability to perform block writes with reduced power consumption, even where synchronous memories or other memories using pulsed I/O lines are used.

Other power conserving features are also provided. In one embodiment, the local I/O write drivers are provided with different sets of drive transistors, so that during a block write cycle additional drive is provided to write data to, e.g., eight different memory cells. During a normal write cycle, the drive is reduced as only a single memory cell is written to. This conserves power and ensures greater drive is used only when needed.

Embodiments of the present invention also maintain the local I/O lines at a set differential position during a block write (representing the data from the color register at the start of the block write). This eliminates the need to continually cycle the local I/O lines, thereby reducing power dissipated during block write cycles.

In another embodiment, local write drivers are selected by local I/O select signals. During a block write cycle, the local I/O lines may be unfrozen by receipt of a local I/O select signal. This permits use of features of the present invention in block write devices having write per byte as well as write per bit control.

For a fuller understanding of the nature and advantages of the invention, reference should be made to the ensuing description taken in conjunction with the accompanying drawings.

DESCRIPTION OF SPECIFIC EMBODIMENTS

Figure 1:
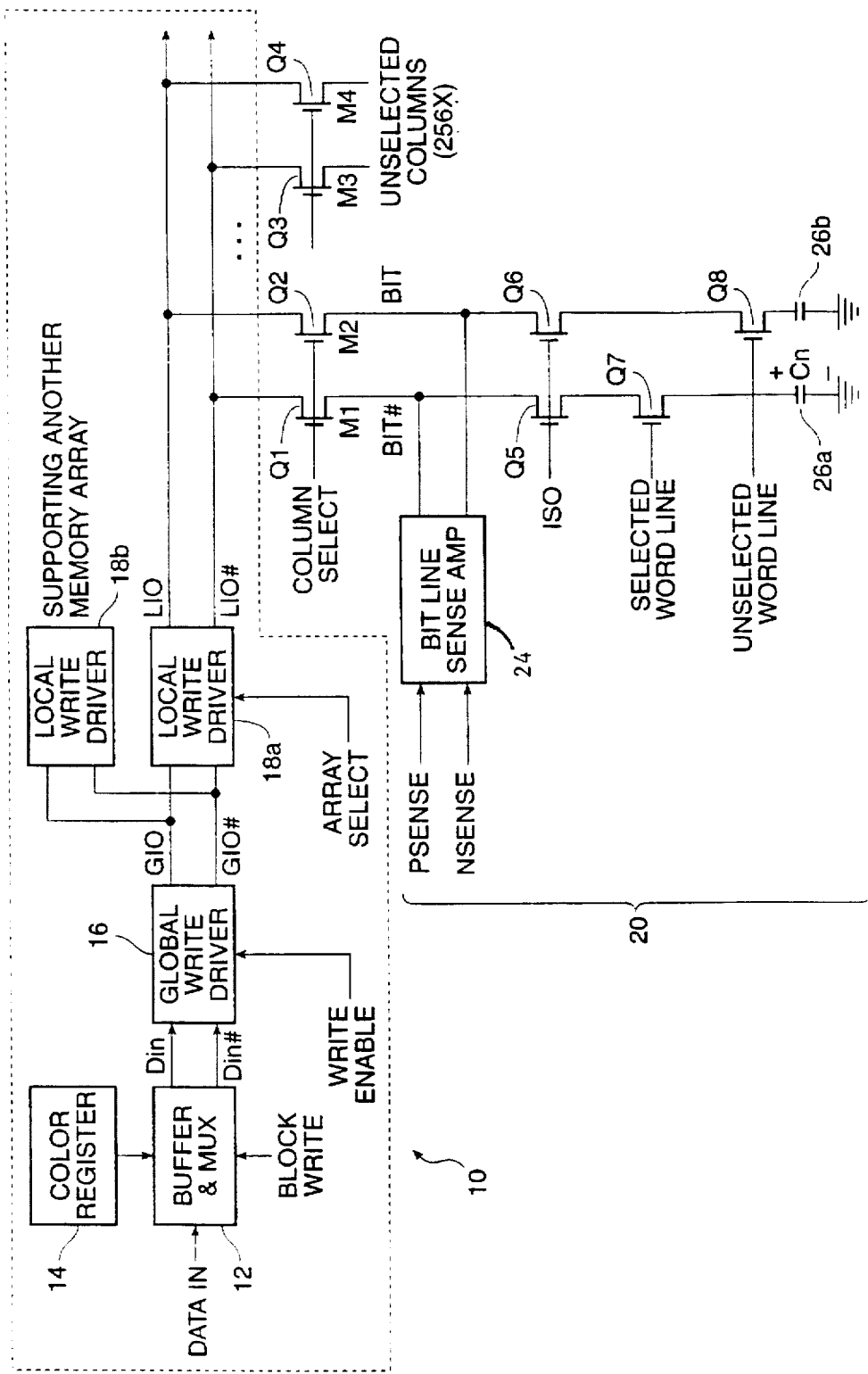
FIG. 1 is a block diagram depicting a conventional write data path for a dynamic random access memory device having block write capabilities.

Operation of a typical video DRAM will first be described by referring to FIG. 1, where the front end 10 and back 20 ends of a typical video DRAM write data path are shown. The front end 10 of the write data path includes everything from the data source (e.g., color register 14 or data from data input lines), buffer and multiplexor circuit 12, global write driver 16, and local write drivers 18. Those skilled in the art will recognize that a typical memory device will include, for example, a global write driver 16 for each bank of the memory, and a number of local write drivers 18, one for each memory array within a bank.

The back end 20 of the write data path includes bit line sense amplifiers 24, associated bit lines (bit and bit#), and individual storage cells 26a,b coupled to the bit lines through the word line (row decode) pass gates Q7, Q8. Those skilled in the art recognize that for memory devices having more than one I/O, each I/O would include a separate write data path as described herein.

During write operations, the differential voltage applied to the local I/O lines (LIO, LIO#) overwrites the bit line sense amplifier, and causes the bit lines to reverse their rail voltages VDD and VSS when new data is of opposite polarity to the old data. The new bit line voltage is transferred to the appropriate storage cell through the word line pass gate Q7.

Data to be stored in a memory array is normally input to the DRAM device on the Data In pin of the device. The Data In signal is input to a data in buffer 12 which amplifies the signal and produces either a rail to rail differential signal on its outputs or else a single ended rail voltage. The output of the data in buffer 12 is input to the global write driver 16. When write enable is not asserted, no differential signal is passed to the output of the global write driver 16 and the output signals GIO, GIO# remain in an equilibrated state with little or no power being consumed. When write enable is asserted, the global write driver 16 amplifies the signal at its input and produces a rail to rail differential voltage on GIO and GIO#. The logical memory array is composed of multiple physical subarrays, each having its own local I/O write driver circuit 18 and local I/O lines LIO, LIO#. By dividing the logical array into multiple physical subarrays, each with its own local I/O lines, the capacitive loading on each local I/O line can be reduced. Not only does this reduce the time required to achieve the proper differential signal on the local I/O lines (and thus reduce the write time) but the current required to switch the local I/O lines from one rail voltage to another is significantly reduced. That is, for a given operating frequency and rail to rail voltage swing, the current dissipation required to switch a capacitive node from one designated voltage to another will grow proportionally to the capacitance on that node.

Still referring to FIG. 1, basic features of a block write implementation will now be described. The most common implementation of block write supports a graphics drawing mode known as transparent mode. In this implementation, the data being written to memory is the same for all column locations in the block. Additional masking circuitry may be employed to enable writing of any subset of the eight column locations with the contents of the color register 14. Thus, for each of the eight columns selected on a block write cycle, logic determines whether the contents of the color register 14 will be written, or whether no write will take place to that column. Because the write data source (the color register 14) is the same for all eight columns in the block, a single pair of local I/O lines can be interfaced to all eight columns for the purpose of over-writing the associated bit line sense amplifiers 24. This minimizes die area. Just as importantly, the single pair of I/O lines minimizes current draw, since only one pair of highly capacitive I/O lines needs to be charged or discharged. Nevertheless, the charging and discharging of the global and local I/O lines can be the single largest component of current during the block write operation, equalling or surpassing the current drawn by the eight bit line sense amplifiers 24 and associated bit lines.

A more powerful, albeit more expensive form of block write is to use two separate color registers 14 as data sources. In terms of the associated graphics applications, this provides for both a foreground and a background color for drawing pixels on a graphics display. This is useful for so called opaque drawing modes in graphics applications and generally allows for faster drawing than the transparent drawing mode. Because each column can be written by two separate data sources, twice as many I/O lines are required, increasing the cost of the chip. More importantly, current draw is dramatically increased since twice as many highly capacitive I/O lines must be charged and discharged.

Thus, achieving high performance write operation generally requires fast charge and discharge of a network of highly capacitive I/O lines in the write data path. This fast charge and discharge leads to high current and therefore high power dissipation. Block write operations compound the current draw problem since as many as eight times as many cells 26, bit lines, and bit line sense amplifiers 24 need to be switched. A major component of the total current drawn during block write is that required to switch the global and local I/O lines in the write data path. The transparent implementation of block write requires only a single set of I/O lines for each of the eight columns in the block, and is thus best suited for minimizing current, although the total current drawn is still much higher than for conventional (single address) write operations. The opaque implementation of block write essentially doubles the portion of the current drawn by the charge and discharge of the I/O line networks.

Existing DRAMs having block write modes switch the front end 10 and the back end 20 of the write data path with every block write. Thus, a great amount of power is dissipated. According to the invention, the amount of power dissipated is reduced substantially by freezing the front end 10 during block writes.

EXEMPLARY CIRCUIT LAYOUT

Figure 2:
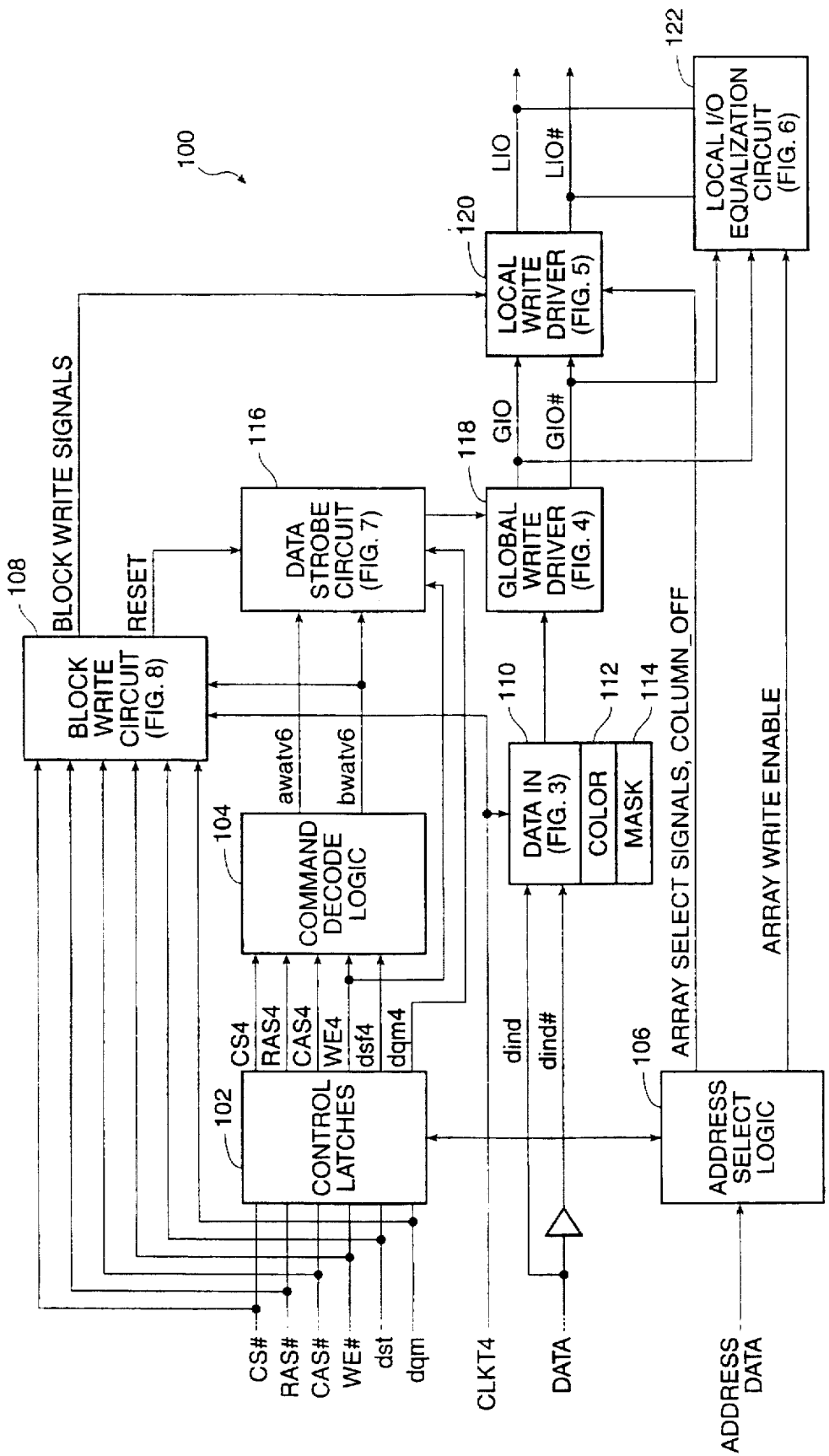
FIG. 2 is a block diagram depicting the front end of a write data path according to an embodiment of the present invention.

Referring now to FIG. 2, a block diagram depicting a front end 100 of a write data path according to an embodiment of the present invention is shown. This front end 100 is used in conjunction with a number of back ends 20 as described above in conjunction with FIG. 1. For the purposes of discussion, the front end 100 will be described for use in a synchronous memory device. In particular, an eight megabit synchronous graphics DRAM (SGRAM) configuration will be used to describe features of the present invention. The SGRAM is logically organized as 128k words by 32 bits per word by two separately addressable banks of memory. The 128k words within each bank are arranged in logical matrices containing 512 rows and 256 columns. An eight address by 32 bit per address block write function will be used as an example block write. To simplify the discussion, only one of the 32 bits (and therefore only one of the write data paths) will be described. Each write data path may be coupled to an I/O write control signal which, when negated, serves to mask the write operation on or off, independent of write operations occurring concurrently on other I/Os. In a first embodiment of this invention, such an I/O control signal will be mentioned and assumed asserted during all cycles to simplify the discussion. In a second embodiment, description will be made as to how the invention can be implemented when such an I/O control signal is alternately negated and asserted during a sequence of block write operations.

Upon reading this disclosure, those skilled in the art will recognize that features of the present invention may be implemented in any of a variety of memory architectures having block write modes. While a synchronous memory will be described, features of the invention may also be implemented in other memory devices using highly capacitive precharged write signal lines such as those found in asynchronous DRAMs.

A front end 100 implemented in accordance with the present invention, in contrast to the front end of FIG. 1 and other existing front ends of write data paths, eliminates the extra power dissipation required for multiple, continuous block write cycles by avoiding the need to continually pulse the global I/O lines after the first block write of a block write cycle. Instead, the global I/O lines remain in a steady, equilabrated state, and the local I/O lines remain split at their rail voltages at the end of the first block write cycle and throughout subsequent block write (or NOP) cycles. Once the last block write cycle is complete, the front end 100 returns to normal operation as described above in conjunction with FIG. 1.

Front end 100 consists of control latches and command decode logic 102, 104 designed to receive and buffer control signals. These control signals, which will be discussed further below, include row and column strobe and write enable signals commonly used and known to those skilled in the art for accessing DRAM cells. Address select logic 106 receives an input address to select a particular local write driver 120 for use. For example, the address information can designate a specific array in the memory and a row address within that array. Information from the address select logic 106 is also used to control a local I/O equalization circuit 122 to equilibrate global and local I/O lines. That is, a specific local I/O equalization circuit is selected for use with an enable signal from the address select logic.

A data input circuit 110 is provided to pass input data from an input data pin and may also pass input data from one or more color registers 112 and mask registers 114. Individual data input circuits are provided for each data pin (in this example embodiment, eight pins are employed). Each data input circuit 110 provides the data to a corresponding global write driver circuit 118 which is controlled by an output from data strobe circuit 116. A block write circuit 108 operates in conjunction with these components to control block writes, as will be described more fully below. To simplify the discussion of the overall structure of a front end 100 of the present invention, detailed signal descriptions were not given with the top level block diagram of FIG. 2. A specific embodiment with signal descriptions will now be provided by describing each of the blocks introduced in conjunction with FIG. 2 in more detail. Operation of the front end 100 will then be described by referring to specific operational examples.

Data input circuit 110 (FIG. 3) receives data from an input pin dind. This data input circuit may be, e.g., one of eight circuits to receive one of eight data inputs. Data on input pin dind (and its complement, dind#) is latched on clock signal clkt4 as input signal din. A number of NOR gates 142, 144, 146, 148, and 152 are coupled to receive the input signal din, input from a color register 112, a mask register 114, and a write per bit signal wpb. Two pairs of data paths are thus provided in the data input circuit 110. A first path is formed for masked data from the input pin (dind). This path outputs a data signal q and its complement (q#). A second path is formed for masked data from the color register 112, and outputs a block write data signal bwq from NOR gate 148 and its complement, bwq# from NOR gate 146.

Control signals are being switched at about the same time that data is being placed on output lines of the data input circuit 110. Specifically, control signals for each I/O (here, the control signals associated with clock signal clkt4) are low when clkt4 is low. These signals (which include the cs4, ras4, cas4, we4, and dsf signals known to those skilled in the art, and which are shown in FIG. 2) are provided to the command decoder logic 104 to signal whether, e.g., a normal write or a block write is in progress. For example, in one specific embodiment, one combination of control signals (ras4=0, cas4=1, we4=1, dsf4=0, and cs4=1) signifies that a normal write cycle is in progress, while a second combination of control signals (ras4=0, cas4=1, we4=1, dsf4=1, and cs4=1) signals a block write cycle. Command decoder logic 104 generates a normal write cycle signal (nwatv4) or a block write cycle signal (bwatv4), depending upon the combination of control signals input.

Figure 7:
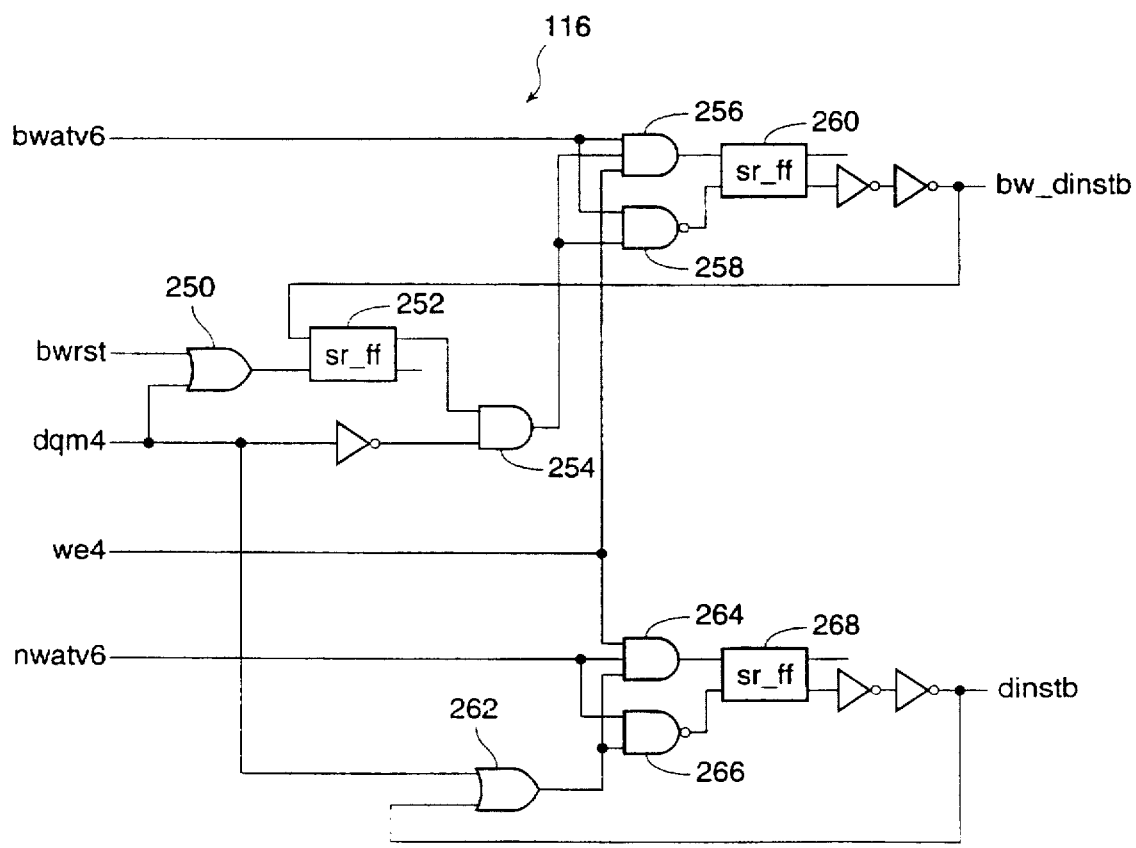
FIG. 7 is a block diagram depicting a data strobe circuit for use in the front end of FIG. 2.
Figure 8:
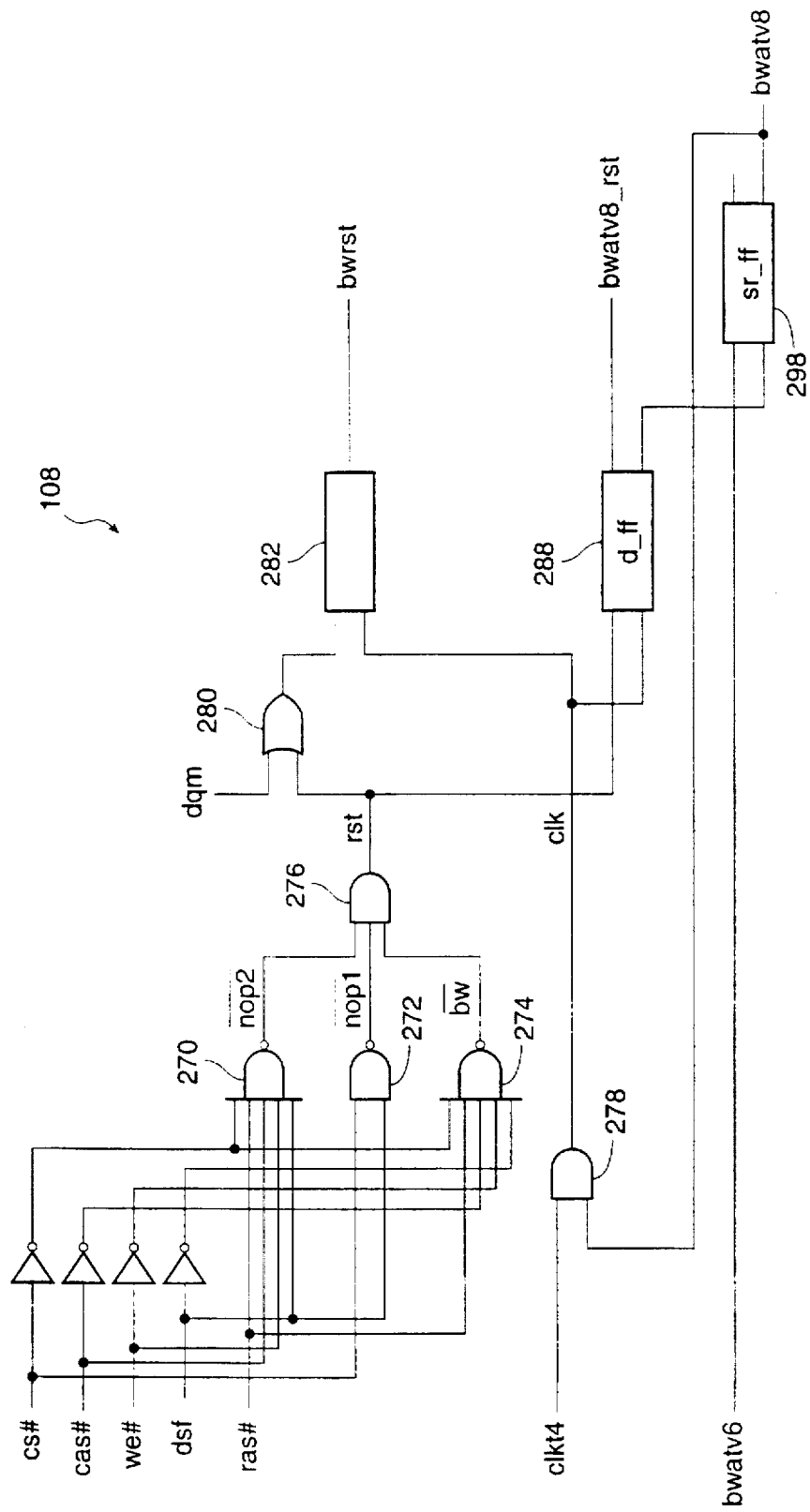
FIG. 8 is a block diagram depicting a block write control circuit for use in the front end of FIG. 2.

Delayed normal write cycle (nwatv6) and block write cycle (bwatv6) signals are input to the data strobe circuit 116 (FIG. 7). The data strobe circuit generates either a block write strobe signal (bw_dinstb) or a normal data strobe signal (dinstb) depending upon whether a block write or a normal write activation signal (bwatv6 or nwatv6) was received from the command decoder logic 104. The data strobe circuit 116 also receives a write enable (we4) input and an I/O enable signal (dqm4), both of which are used to enable the data strobe circuit. For the purposes of explanation, unless noted otherwise, the dqm4 signal is assumed to be asserted (low) on each cycle. Finally, a block write reset signal (bwrst) is input from the block write circuit 108 (FIG. 8). Each I/O has its own block write reset signal (bwrst). For the purposes of discussion, generation of only a single block write reset signal is shown; however, those skilled in the art will be able to add appropriate circuitry to generate additional block reset signals where needed. The block write reset signal will be generated, as discussed in more detail below, on the first subsequent cycle which is not a block write or a NOP cycle. Strobe signals output from the data strobe circuit 116 are input to the global write driver circuit 118.

Global write driver circuit 118 (FIG. 4) receives the two sets of data signals output by the data input circuit 110 (i.e., signals q, q#, bwq, bwq#). A global write per bit signal (wpb_gio) is also passed to the global write driver circuit. The global write per bit signal (wpb_gio) is generated from a global write per bit signal (wpb) and a write per bit mask register. If wpb is low, the enable# signal is low and the global write driver is enabled for write operation. If wpb is high, then the contents of the I/O mask register is passed to the enable# signal. If the mask register contains a logic 0 (wpb is high), enable# is high and the global write driver is disabled by pulling q, q#, bwq, and bwq# all low. If the mask register contains a logic 1 (wpb is high), then enable# is low and the global write driver circuit is enabled for write operation. For purposes of describing the invention, the enable# signal is assumed low at all times.

Circuit 118 includes parallel signal paths for the two sets of input signals and their complements. Buffered input signals q and q# are re-evaluated whenever clock signal clkt4 is high. Clock signal clkt4 is a self-timed positive pulse created by the positive edge of the external clock signal. When the clkt4 pulse expires, the R and S inputs of SR flip-flop 134 go low, maintaining the state of din until the next positive pulse of clkt4. Buffered signals bwq and bwq# are generally static signals, since the contents of the color register, the mask register, and the wpb signal are loaded well in advance of any write or block write operations and maintain their state throughout the write or block write operations. Signals q and q# should be valid and stable during the entire dinstb pulse high period. Likewise, bwq and bwq# should be valid and stable during the entire bw_dinstb pulse high period.

At the beginning and end of any write cycle, global I/O lines GIO, GIO# are equalibrated and precharged to VDD. During a normal write, a positive pulse on dinstb is input to the global write driver circuit 118 and is ANDed with signals q/q# (AND gates 166 and 190), resulting in a negative pulse on either GIO or GIO#. For example, if q=1 and q#=0, then a logic one is to be written and accordingly GIO# is strobed low. Likewise, during a block write, a positive pulse on bw_dinstb is input to the global write driver circuit 118 and is ANDed with signals bwq/bwq# (AND gates 160 and 184), resulting in a negative pulse on either GIO or GIO#. For example, if bwq=0 and bwq#=1, then a logic zero is to be written and accordingly GIO is strobed low.

Those skilled in the art will recognize that the particular logic gates used to implement this function can vary while achieving the same results. This invention is therefore not limiting in this sense.

Figure 5:
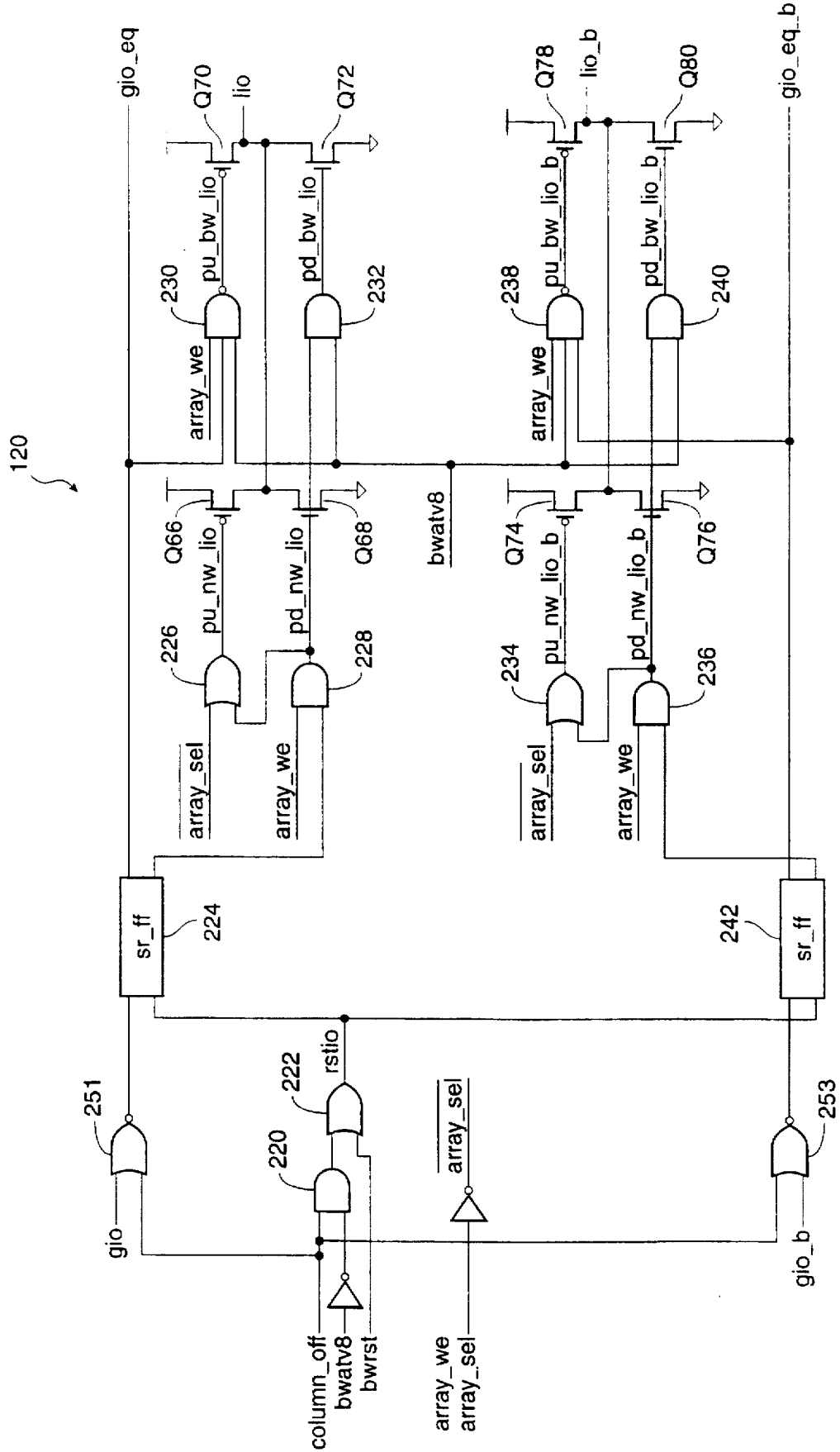
FIG. 5 is a block diagram depicting a local write driver circuit for use in the front end of FIG. 2.

Outputs from the global write driver circuit 118 are received by one of a number of local write driver circuits 120 (FIG. 5). Control signals, including array selection signals (array_sel and array_sel#), an array write enable signal (array_we), a column address timing control signal (column_off), a latched block write control signal (bwatv8), and a block write reset control signal (bwrst) are also received in the local write driver circuits 120 to control assertion of selected local I/O lines LIO, LIO#. The column address timing control signal, the block write control signal, and the block write reset signal are all combined in AND gate 220 and OR gate 222 to generate a local reset signal (rstio) for each I/O. For example, the rstio signal is forced low when the inputs are all low, thus preventing SR flip-flops 224 and 242 from resetting. If GIO is strobed low, signal gio_eq is latched to logic 0. If GIO# is strobed low, signal gio_eq# is latched to logic 0. Array selection and enable signals determine whether a pulse is then generated on one of the local I/O lines.

A local I/O equalization circuit 122 (FIG. 6) is provided to equalize the local I/O lines. This circuit receives an array write enable signal (array_we) from the address select logic 106 and uses it in conjunction with the gio_eq and gio_eq# signals input from local write driver circuit 120 (FIG. 5) to control the equalization of the local I/O lines LIO, LIO#.

OPERATION DURING A NORMAL WRITE CYCLE

Explanation will now be given regarding operation of the front end 100 according to the present invention during a normal write cycle (i.e., a non-block write to the memory). On a first clock cycle, a local array address and a row address within the local array is presented to address select logic 106 on input signal pins. The address information is combined with suitable timing and control signals to generate an array control signal array_sel. This array control signal is input to the local write driver circuits 120 to select a local array for a read or write operation. Specifically, the selection prepares the local I/O lines LIO, LIO# for a read or write operation by moving them from an equilibrated state near ½ VDD to an equilibrated state at VDD. This is seen by referring to FIG. 5, where one particular embodiment of a local write driver circuit 120 is shown. Signal array_sel is asserted high, causing complement signal array_sel# to go low. When array_sel transitions high, gio and gio# are both high, and the q outputs of SR flip-flops 224 and 242 are low. This maintains the outputs of AND gates 228 and 236 low, keeping NMOS transistors Q68 and Q76 off, and causes the outputs of OR gates 226 and 234 to go low, turning on PMOS transistors Q66 and Q74 and pulling both LIO and LIO# to VDD. This operation is consistent with the Bank and Row activation of Synchronous DRAMs and SGRAMs.

On a subsequent clock cycle data on the DATA terminal (FIG. 2) is buffered and latched by the data in circuit 110 on the positive edge of buffered clock pulse clkt4. Concurrently, control signals cs#=0, ras#=1, cas#=0, we#=0, dsf=0, and byte enable signal dqm are buffered and latched by clkt4 in control latch circuit 102. Subsequently, the normal write data outputs (q and q#) switch. If the signal at dind of FIG. 3 was low during the clkt4 clock pulse, q switches to a logic 0 and q# switches to a logic 1. If the signal at dind was high during the clkt4 clock pulse, q switches to a logic 1 and q# switches to a logic 0. Concurrently, latched control signals cs4, ras4, cas4, we4, dsf4, and dqm4 switch. Signal dqm4 is an active low I/O write control signal as described earlier. The signal, for the purposes of this discussion, is assumed to be asserted low during every cycle (i.e., the I/O is enabled). Control signals cs4, ras4, cas4, we4, and ds4 are low whenever clkt4 is low. Consequently, cs4, ras4, cas4, we4, and ds4 are active high, pulsed signals delayed from clkt4. Concurrently, a column address is latched by the address select logic 106.

A short time later, the command decode logic 104 receives as input control signals ras4=0, cas4=1, we4=1, dsf4=0, and cs4=1. This combination signifies that a normal write cycle is in progress. A positive pulse is generated on normal write signal nwatv6 and provided to the data strobe circuit 116 (FIG. 7). This signal is ANDed (in gates 256, 264) with write enable signal we4 and byte enable signal dqm4 inside the data strobe circuit 116. Since the I/O enable signal dqm4 is asserted (low) concurrent with positive pulses on nwatv6 and we4, a self timed positive pulse occurs on the normal write data strobe output signal (dinstb). Concurrently, the address select logic 106 generates signals which are used to address a particular array.

Figure 4:
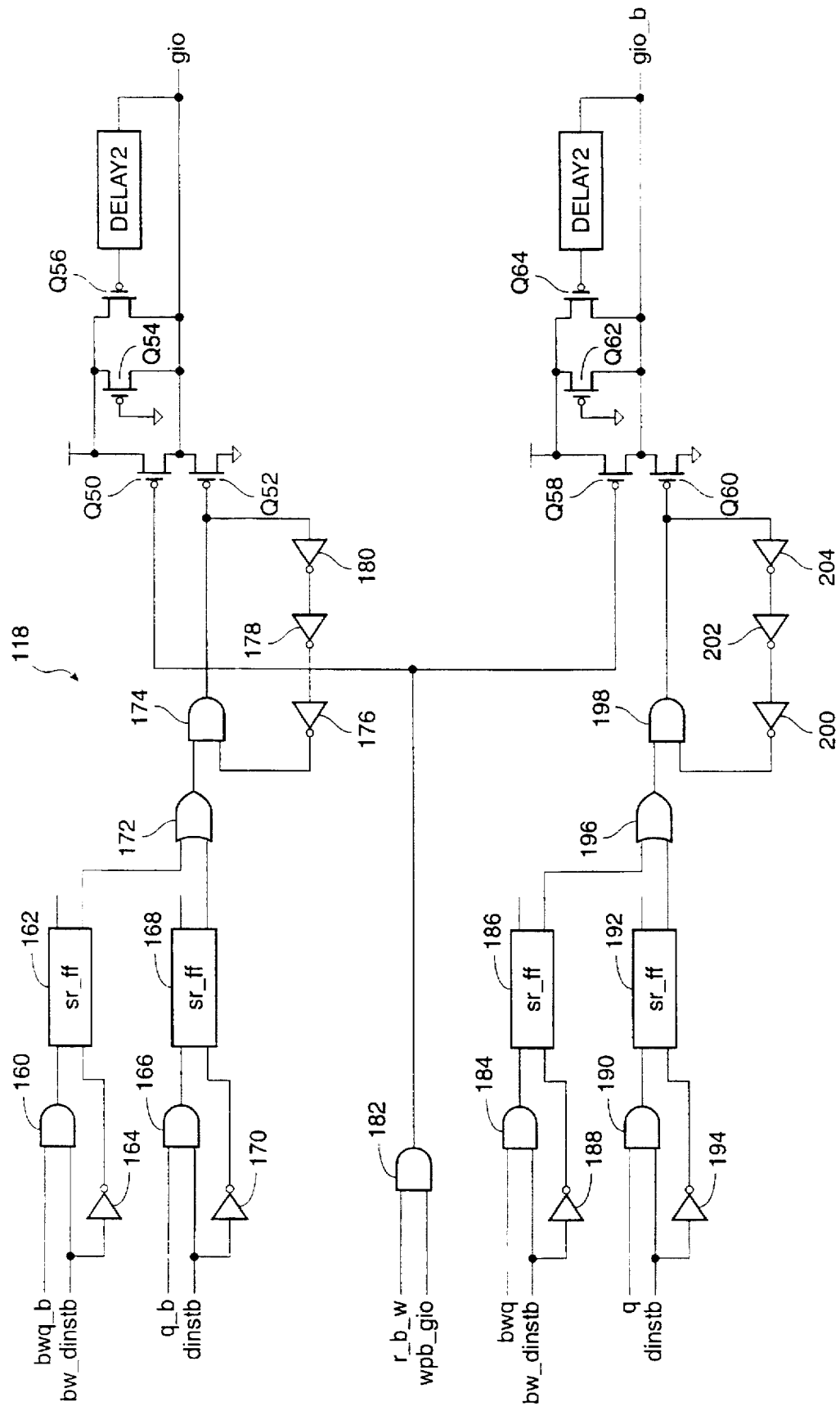
FIG. 4 is a block diagram depicting a global write driver circuit for use in the front end of FIG. 2.

The pulse on signal line dinstb is input to the global write driver circuit 118 of FIG. 4 and is input to AND gates 166, 190 with signals q and q#, resulting in a self timed negative pulse on either GIO or GIO#. If q=1 and q#=0, GIO# is strobed low.

The negative strobe on GIO or GIO# sets one of two SR flip-flops 224, 242 inside the local write driver circuit 120 of FIG. 5. The flip-flops have inverted outputs gio_eq and gio_eq#. Column address timing control signal (column_off), latched block write control signal (bwatv8), and block write reset control signal (bwrst) are all low, forcing the local I/O reset signal (rstio) low and preventing SR flip-flops 224, 242 from resetting. If GIO# is strobed low, gio_eq is latched to a logic 0. If GIO is strobed low, gio_eq# is latched to a logic 0.

Figure 6:
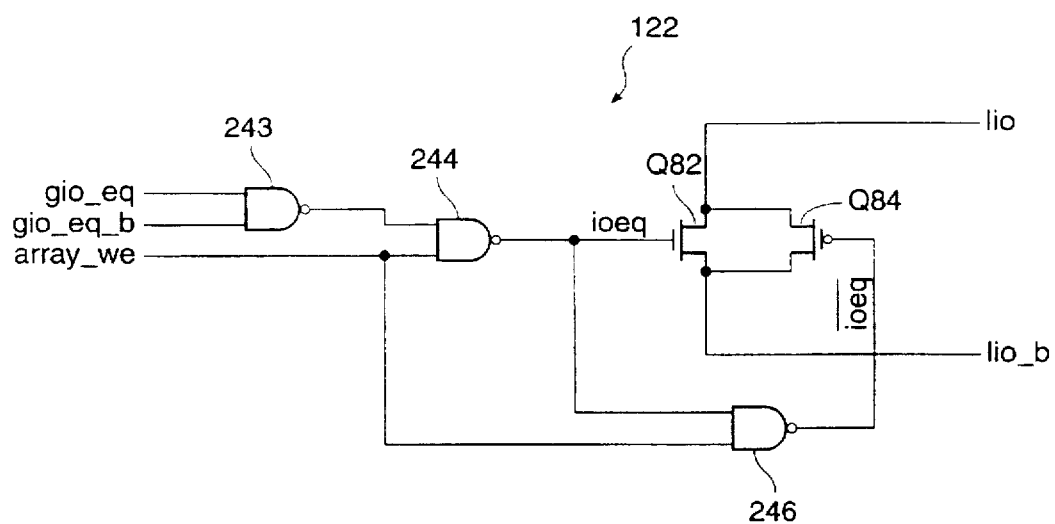
FIG. 6 is a block diagram depicting a local I/O equalization circuit for use in the front end of FIG. 2.

Signals gio_eq and gio_eq# are input to NAND gate 243 inside local I/O equalization circuit 122 (FIG. 6). The output of NAND gate 243 is thus high and is input to NAND gate 244 with array write enable signal array_we, which is asserted (high). This causes node ioeq to go low and node ioeq# to go high, turning off NMOS device Q82 and PMOS device Q84 and releasing LIO and LIO# from their equilibrated state. By releasing LIO and LIO# from their equilibrated state, either LIO or LIO# can be brought low while the other remains at VDD.

Concurrently, the logic gates within the local write driver circuit 120 (FIG. 5) determine when the local I/O lines (LIO or LIO#) should be brought low for the purpose of writing data. For purposes of discussion, assume a logic 0 is to be written. That is, assume that GIO has been pulsed low, setting RS flip-flop 224 and causing its q output to go to logic 1 and its q# output (gio_eq) to go to a logic 0. Since no negative pulse has occurred on GIO#, the q output of SR flip-flop 242 remains at logic 0 and the q# remains at logic 1. Also assume that array select signal array_sel is at logic 1. Array write enable signal array_we is brought high, causing the output of AND gate 228 to go high and the output of OR gate 226 to go high. This turns NMOS device Q68 on and PMOS device Q66 off (both Q66 and Q68, in one specific embodiment, are 50 micron transistors). Block write enable signal bwatv8 is low, keeping block write driver PMOS transistor Q70 and block write driver NMOS transistor Q72 off (which may be, respectively, a 100 micron and a 138 micron device). Thus, node LIO is brought low exclusively through NMOS transistor Q68. Since the q output of SR flip-flop 242 remains low, the output of AND gate 236 is low and the output of OR gate 234 is low, keeping PMOS device Q74 on and NMOS device Q76 off. Because bwatv8 is low, the output of NAND gate 238 is high, keeping block write PMOS driver transistor Q78 off. The output of AND gate 240 is low, keeping block write NMOS driver transistor Q80 off. Thus, LIO# remains held high exclusively through PMOS device Q74. Concurrently, a positive pulse is generated on the column select signal and sent to the gates of the column select pass gates (FIG. 1).

The negative pulse on LIO is coupled to the cross coupled sense nodes of the bit line sense amplifier 24 via the column decode pass gates Q1–Q4. The column pass gates associated with exactly one column address are activated (turned on). The pulse on LIO is sufficient to flip the latched nodes of one bit line sense amplifier to their opposite states. That is, the local I/O line drive capability is minimized to drive a single column. In one specific embodiment, a single 50 micron transistor is used when a single column is all that need be driven. Single columns are driven during normal write modes. As will be discussed, embodiments of the present invention provide greater drive capacity when needed (i.e., for block writes).

When the trailing edge of the pulse on a column select signal occurs, a positive pulse on column_off is generated by the address select logic 106. Signal column_off is input to the local write driver circuit 120 (FIG. 5). Since block write signal bwatv8 is low, the pulse on column_off causes the output of AND gate 220 to pulse high, and the output of NOR gate 251 to go low, which causes LIO reset signal rstio to pulse high, bringing gio_eq back high. This causes the output of AND gate 228 to return low, turning off NMOS device Q68 and the output of OR gate 226 to go low, turning on PMOS device Q66. PMOS device Q66 thus begins to return LIO back to VDD. Signal gio returns high before or during the column_off pulse. Concurrently, gio_eq returning high causes the output of NAND gate 243 in local I/O equalization circuit 122 (FIG. 6) to go low and the output of NAND gate 244 to go high. This pulls node ioeq high and ioeq# low, shunting the local I/O lines LIO, LIO# to an equilibrated state.

This completes the normal write operation with GIO, GIO# and LIO, LIO# reset to an equilibrated high state. The operations described in the steps above would repeat if subsequent normal write operations were invoked.

OPERATION DURING A FIRST BLOCK WRITE CYCLE

Discussion will now be given regarding operation of the front end 100 according to the present invention in a block write mode. An initial block write cycle will first be described. The discussion of block write cycles assumes that an array and row select operation has already occurred.

Figure 3:
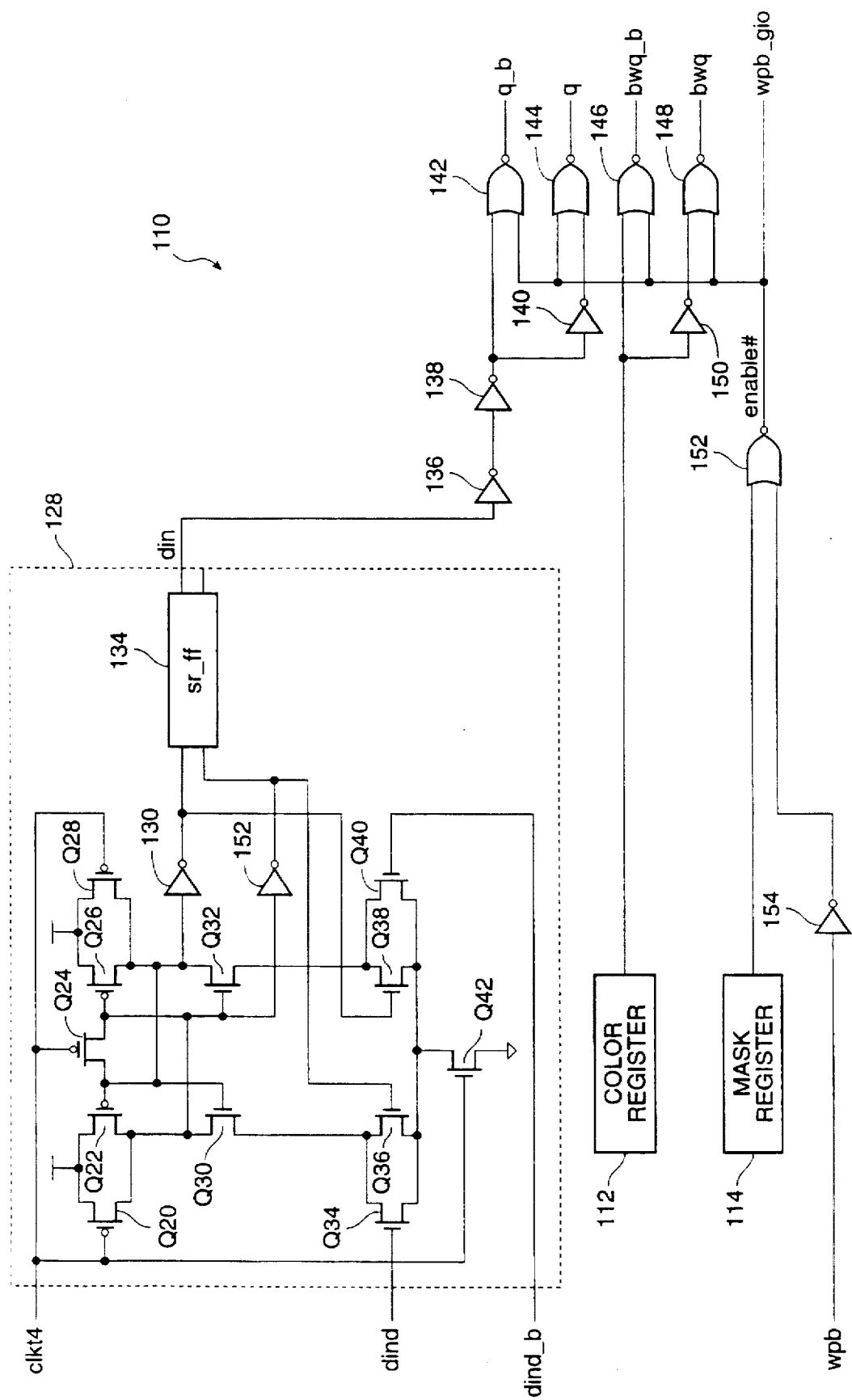
FIG. 3 is a block diagram depicting a data input circuit for use in the front end of FIG. 2.

At the beginning of a first block write cycle, the data from the color register 112 is coupled to the bwq, bwq# outputs of the data in circuit 110 shown in FIG. 3. If the color register 112 contains a logic 0, bwq is at logic 0 and bwq# is at logic 1. If the color register 112 contains a logic 1, bwq is at logic 1 and bwq# is at logic 0. Concurrently, control signals cs#=0, ras#=1, cas#=0, we#=0, dsf=1, and byte enable signal dqm are buffered and latched by clkt4, causing control signals cs4, ras4, cas4, we4, dsf4, and dqm4 to switch. Again, signal dqm4 is an active low I/O control signal which, for the purposes of discussion, is assumed to be asserted low unless indicated otherwise. Control signals cs4, ras4, cas4, we4, and ds4 are low whenever clkt4 is low. Consequently, cs4, ras4, cas4, we4, and ds4 are active high, pulsed signals delayed from clkt4. Concurrently, column address data is latched by the address select logic 106.

A short time later, command decode logic 104 receives as input delayed control signals ras4=0, cas4=1, we4=1, dsf4=1, and cs4=1. This combination signifies that a block write cycle is in progress. Command decode logic 104 generates a positive pulse on the block write activation signal (bwatv6). Signal bwatv6 is ANDed with write enable signal we4 and byte enable signal dqm4 in data strobe circuit 116 (FIG. 7). Since dqm4 is asserted (low) concurrent with positive pulses on bwatv6 and we4, a self timed positive pulse occurs on block write data strobe output signal bw_dinstb. The positive pulse on bw_dinstb is fed back to a set input of reset inhibit RS flip flop 252. Setting of the flip-flop inhibits the bw_dinstb signal from re-occurring until the reset inhibit latch is reset by receipt of a block write reset signal (bwrst). Signal bwrst will be generated on the first subsequent cycle which is not a block write or a NOP cycle.

Referring to FIG. 8, the positive strobe on block write activation signal bwatv6 also causes latched signal bwatv8 to be asserted high. Signal bwatv8 remains high until a command is issued which is not a block write or a NOP cycle. Concurrently, the address select logic 106 generates select signals which are used to decode the column addresses to be written to. As many as eight outputs from the column decoder (the column select signals) are coupled to appropriate column decode pass gates in a selected local array.

The pulse on bw_dinstb is input to the global write driver circuit 118 (FIG. 4) and is ANDed with bwq and bwq# in AND gates 160, 184, resulting in a self-timed negative pulse on either GIO or GIO#. If bwq=0 and bwq#=1, GIO is strobed low. If bwq=1 and bwq#=0, GIO# is strobed low. The negative strobe on GIO or GIO# is input to local write driver 120 in FIG. 5 and sets one of two SR flip-flops 224, 242 which have inverted outputs gio_eq and gio_eq#. Concurrently, column address timing control signal column_off is low, latched block write control signal bwatv8 is high, and block write reset control signal bwrst is low. Thus, the output of AND gate 220 is low, holding LIO reset signal rstio low and preventing SR flip-flops 224 and 242 from resetting. If GIO is strobed low, gio_eq is latched to a logic 0. If GIO# is strobed low, gio_eq# is latched to a logic 0.

Signals gio_eq and gio_eq# are input to NAND gate 243 inside local I/O equalization circuit 122 (FIG. 6). The output of NAND gate 243 is thus high and is NANDed with array write enable signal array_we, which is asserted (high). This causes node ioeq to go low and ioeq# to go high, turning off NMOS device Q82 and PMOS device Q84 and releasing LIO and LIO# from their equilibrated state. By releasing LIO and LIO# from their clamped, equilibrated state, either LIO or LIO# can be brought low while the other remains at VDD. Concurrently, the logic gates within the local write driver circuit 120 determine when either LIO or LIO# should be brought low for the purpose of writing data. For purposes of discussion, assume that a logic zero is to be written. That is, GIO has been pulsed low, setting RS flip-flop 224 (FIG. 5) and causing its q output to go to a logic 1 and its q# output (gio_eq) to go to a logic 0. Since no negative pulse has occurred on GIO#, the q output of SR flip-flop 242 remains at a logic 0 and the q# output remains at a logic 1. Also assume that array select signal array_sel is at a logic 1. Array write enable signal array_we is brought high, causing the output of AND gate 228 to go high and the output of OR gate 226 to go high. This turns NMOS device Q68 on and PMOS device Q66 off (both of which may be 50 micron devices). Since gio_eq is low, the output of NAND gate 230 is high and thus block write driver PMOS transistor Q70 is off (which may be a 100 micron transistor). On the other hand, since block write control signal bwatv8 is high, the output of AND gate 232 is high, turning on block write driver NMOS transistor Q72 (which may be a 138 micron device). Thus, node LIO is brought low through both NMOS transistors Q68 and Q72. This additional drive is required to write the additional columns selected by the block write. Since the q output of SR flip-flop 242 remains low, the output of AND gate 236 is low and the output of OR gate 234 is low, keeping PMOS device Q74 on and NMOS device Q76 off. Because block write control signal bwatv8 is high and gio_eq# is also high, the output of NAND gate 238 is low, turning on block write PMOS driver transistor Q78. This additional drive is required to write the additional columns selected by the block write. Concurrently, a positive pulse is generated on the column select signal and sent to the gates of the column decode pass gates. As a result, embodiments of the present invention provide a relatively low drive signal for single column writes and a relatively high drive signal for multiple column rights to conserve average power.

The negative pulse on LIO is coupled to the cross coupled sense nodes of a bit line sense amplifier via column select pass gates. The column pass gates associated with as many as eight column addresses are activated (turned on). The additional drive strength of the block write driver transistors (Q70, Q72, Q78, and Q80) provide for a pulse of sufficient drive and duration to flip the latched nodes of as many as eight selected bit line sense amplifiers to their opposite states. That is, memories employing features of the present invention provide additional drive capacity only when needed (i.e., when a block write is underway).

While latched block write enable signal bwatv8 is high (i.e., during block write cycles) column_off is prevented from pulsing when the trailing edge of the column select pulse occurs. With reference to the local write driver circuit 120 (FIG. 5), latched block write enable signal bwatv8 is high but the block write reset signal bwrst is low, so LIO reset signal rstio does not pulse high, and SR flip-flops 224 and 242 do not reset. NMOS device Q68 and Q72 remain on, as so PMOS devices Q74 and Q78, so LIO and LIO# remain in their differential state.

This completes the first of several block write cycles. The block write data strobe signal bw_dinstb has been disabled from occurring until a cycle other than a block write or NOP occurs. This means that no negative pulses can occur on global write data lines GIO, GIO# while subsequent block write cycles are occurring. In essence, GIO and GIO# have been frozen. Also, local I/O lines LIO and LIO# have been set to a differential signal state corresponding to the contents of the color register 112. LIO and LIO# will be maintained in this differential state until a cycle other than a block write or NOP occurs. In essence, LIO and LIO# have been frozen. Further, additional drive capacity has been employed to perform the block write.

OPERATION DURING A SUBSEQUENT BLOCK WRITE CYCLE

Description of the operation of the front end 100 will now be given for a subsequent block write cycle. Referring first to FIG. 3, at the beginning of the next block write cycle, data from the color register 112 is still coupled to the bwq, bwq# outputs of the data input circuit 110. If the color register 112 contains a logic 0, bwq is low and bwq# is high. If the color register 112 contains a logic 1, bwq is high and bwq# is low. Control signals cs#=0, ras#=1, cas#=0, we#=0, dsf=1, and I/O enable signal dqm are buffered and latched by clkt4, causing control signals cs4, ras4, we4, dsf4, and dqm4 to switch. Control signals cs4, ras4, we4, and ds4 are low whenever clkt4 is low. Consequently, cs4, ras4, cas4, we4, and ds4 are active high, pulsed signals delayed from clkt4. Concurrently, the column address is latched by the address select logic 106.

A short time later, the command decode logic circuit 104 receives as input delayed control signals ras4=0, cas4=1, we4=1, dsf4=1, and cs4=1. This combination signifies that a block write cycle is in progress. A positive pulse is generated on block write activation signal bwatv6. Referring to the data strobe circuit 116 (FIG. 7), because reset inhibit flip-flop 252 has been set during the first block write cycle, no activating pulse occurs on either dinstb or bw_dinstb, (assuming that dqm4=0, signifying that the I/O in question is still enabled). With no pulse occurring on either dinstb or bw_dinstb, no pulse occurs on either GIO or GIO#. Also, this combination of control signals cs#, cas#, we#, dsf, and ras# causes the rst signal in block write circuit 108 (FIG. 8) to remain negated (low). Therefore, the state of bwatv8 inside the block write circuit 108 is maintained high.

Because no pulse occurs on either GIO, or GIO#, and because reset of the LIO, LIO# lines has been inhibited, LIO and LIO# remain in their differential state as described above for the first block write cycle. Consequently, no additional power is dissipated as in previous designs.

The differential signal on LIO, LIO# is coupled to the cross coupled sense nodes of as many as eight selected bit line sense amplifiers via the column decode pass gates. Because the block write driver transistors Q72 and Q68 inside local write driver circuit 120 remain turned on, the signal strength of the differential signal on LIO, LIO# is sufficient to flip the latched nodes of as many as eight bit line sense amplifiers to their opposite states. That is, a greater drive capability (as compared to a normal write cycle) is provided for each additional block write cycle.

This completes the second of several block write cycles. All subsequent block write cycles which follow without interruption by another cycle (e.g., a normal cycle) will behave similarly.

OPERATION DURING A FIRST SUBSEQUENT CYCLE

Description will now be given for operation of the circuit 100 for a first subsequent cycle other than a block write cycle or a NOP. At the beginning of the first cycle which is not a block write or NOP (which, for the purposes of this discussion, may be assumed to be a normal write cycle), data on the dind and dind# terminals is buffered and latched by the data in circuit 110 (FIG. 3) on the positive edge of buffered clock pulse clkt4 causing the normal write data outputs (q and q#) of the data in circuit 110 to switch. If the signal at dind was low during the clkt4 clock pulse, q switches to a logic 0 and q# switches to a logic 1. If the signal at dind was high during the clkt4 clock pulse, q switches to a logic 1 and q# switches to a logic 0. Concurrently, control signals cs#=0, ras#=1, cas#=0, we#=0, dsf=0, and I/O enable signal dqm are buffered and latched by clkt4 in the control latches 102. Control signals cs4, ras4, cas4, we4, and ds4 are low whenever clkt4 is low. Consequently, cs4, ras4, cas4, we4, and ds4 are active high, pulsed signals delayed from clkt4. Concurrently, unlatched control signals cs#=0, ras#=1, cas#=0, we#=0, dsf=0, and dqm are coupled to logic gates in the block write circuit 108. This combination signifies that the current cycle is not a block write or NOP. This combination of control signals also causes the master reset signal (rst) in the block write circuit 108 to go high. In one specific embodiment, signal rst is generated by combinatorial logic including NAND gates 270–274 and AND gate 276 as shown in FIG. 8. When the clock pulse on clkt4 occurs, D flip-flop 282 switches, causing an I/O specific block write reset signal bwrst to pulse high. This self-timed pulse resets latched block write control signal bwatv8 back to a logic 0, causing block write driver transistor Q72 inside the local write driver circuit 120 to turn off (FIG. 5). At about this same time, the column address is latched by the address select logic 106.

A short time later, the command decode logic 104 receives control signals ras4=0, cas4=1, we4=1, dsf4=0, and cs4=1 which had been latched in control latches 102. This combination signifies that a normal write cycle is in progress. A positive pulse is generated on normal write signal nwatv6. Concurrently, block write reset signal bwrst=1 causes the output of OR gate 250 inside the data strobe circuit 116 (FIG. 7) to go high, resetting reset inhibit SR flip flop 252. This removes the inhibiting condition on the generation of the block write data strobe signal (bw_dinstb), freeing bw_dinstb to be asserted on the next block write cycle. Concurrently, normal write signal nwatv6 is ANDed with write enable signal we4 and the output of NOR gate 262. Because the block write signal bwatv6 is not asserted, the block write data strobe signal bw_dinstb remains low. Since I/O enable signal dqm4 is asserted (low) concurrent with positive pulses on nwatv6 and we4, a self timed positive pulse occurs on normal write data strobe output signal dinstb.

Concurrently, bwrst=1 is input to local write driver circuit 120 (FIG. 5), causing the output of OR gate 222 to go high. This resets SR flip flop 224, causing its q# output (gio_eq) to return high and its q output to return low. This causes the output of AND gate 228 to go low, turning off NMOS pull down transistor Q68. The output of OR gate 226 is forced low, turning on PMOS pull up transistor Q66 and pulling node LIO toward VDD. Gio_eq going high also causes the output of NAND gate 243 inside the local I/O equalization circuit 122 (FIG. 6) to go low, in turn causing equalizing signal ioeq to go high and its complement ioeq# to go low. This activates shunt transistors Q82 and Q84, causing LIO and LIO# to go to an equilibrated state. At this time, the address select logic 106 generates select signals which are used to decode the column address to be written to. One output from the column decoder (the column select signal) is coupled to the appropriate column decode pass gates in the local array.

The pulse on the normal write data strobe signal dinstb is input to the global write driver circuit 118 (FIG. 4) and ANDed with signals q and q#, resulting in a self timed negative pulse on either GIO or GIO#. If q=0 and q#=1, GIO is strobed low. If q=1 and q#=0, GIO# is strobed low. By this time, the positive pulse on bwrst has expired, and bwrst has returned low.

The negative strobe on GIO or GIO# sets one of two SR flip-flops 224 and 242 inside the local write driver circuit 120 (FIG. 5). The flip-flops have inverted outputs gio_eq and gio_eq#. Column address timing control signal (column_off), latched block write control signal (bwatv8), and block write reset control signal (bwrst) are all low, forcing local I/O reset signal (rstio) low and preventing SR flip-flops 224 and 242 from resetting. If GIO is strobed low, gio_eq is latched to a logic 0. If GIO# is strobed low, gio_eq# is latched to a logic 0.

Signals gio_eq and gio_eq# are input to NAND gate 243 inside local I/O equalization circuit 122 (FIG. 6). The output of NAND gate 243 is thus high and is NANDed with array write enable signal (array_en), which is asserted (high). This causes node ioeq to go low and ioeq# to go high, turning off NMOS device Q82 and PMOS device Q84 and releasing LIO and LIO# from their equilibrated state. By releasing LIO and LIO# from their equilibrated state, either LIO or LIO# can be brought low while the other remains at VDD. Concurrently, the logic gates within the local write driver circuit 120 (FIG. 5) determine when either LIO or LIO# should be brought low for the purpose of writing data. For purposes of discussion, assume that a logic 0 is to be written. That is, GIO has been pulsed low, setting RS flip-flop 224 and causing its q output to go to logic 1 and its q# output (gio_eq) to go to logic 0. Since no negative pulse has occurred on GIO#, the q output of SR flip-flop 242 remains at logic 0 and the q# output remains at a logic 1. Also assume that array select signal array_sel is at a logic 1. Array write enable signal array_we is brought high, causing the output of AND gate 228 to go high and the output of OR gate 226 to go high. This turns NMOS device Q68 on and PMOS device Q66 off. Block write enable signal bwatv8 is low, keeping block write driver PMOS transistor Q70 and block write driver NMOS transistor Q72 off. Thus, node LIO is brought low exclusively through NMOS transistor Q68 (e.g., a 50 micron device). Since the q output of SR flip-flop 242 remains low, the output of AND gate 236 is low and the output of OR gate 234 is low, keeping PMOS device Q74 on and NMOS device Q76 off. Because block write enable signal bwatv8 is low, the output of NAND gate 238 is high, keeping block write PMOS driver transistor Q78 off. The output of AND gate 240 is low, keeping block write NMOS driver transistor Q80 off. Thus, LION remains held high exclusively through PMOS device Q74. Concurrently, a positive pulse is generated on the column select signal and sent to the gates of a column decode pass gate. The drive capability, thus, has been shifted downward from the additional drive capability which had been provided during the block write cycles.

As is known to those skilled in the art, the negative pulse on LIO is coupled to the cross coupled sense nodes of a bit line sense amplifier via column decode pass gates. The column pass gates associated with exactly one column address are activated (turned on). The pulse on LIO is sufficient to flip the latched nodes of one bit line sense amplifier to their opposite states.

Since block write activate signal bwatv8 is not asserted (i.e., is at a logic 0), when the trailing edge of the pulse on the column select signal occurs a positive pulse on column_off is generated by the address select logic 106. Signal column_off is input to the local write driver circuit 120 (FIG. 5). Since the block write activate signal bwatv8 is low, the pulse on column_off causes the output of AND gate 220 to pulse high, which causes LIO reset signal rstio to pulse high, resetting SR flip-flop 224 and bringing gio_eq back high. This causes the output of AND gate 228 to return low, turning off NMOS device Q68 and the output of OR gate 226 to go low, turning on PMOS device Q66. PMOS device Q66 thus begins to return LIO back to VDD. Concurrently, gio_eq returning high cause the output of NAND gate 243 in local I/O equalization circuit 122 to go low and the output of NAND gate 244 to go high. This pulls node ioeq high and ioeq# low, shunting the local I/O lines LIO, LIO# to an equilibrated state.

This completes the operation of a normal write operation which immediately follows multiple block write or NOP cycles. The global and local I/O lines GIO/GIO#, LIO/LIO# are once again reset to an equilibrated high state. The state of the control logic and write data path is identical to that just before the first normal write cycle described above when the normal write cycle began.

Figure 9:
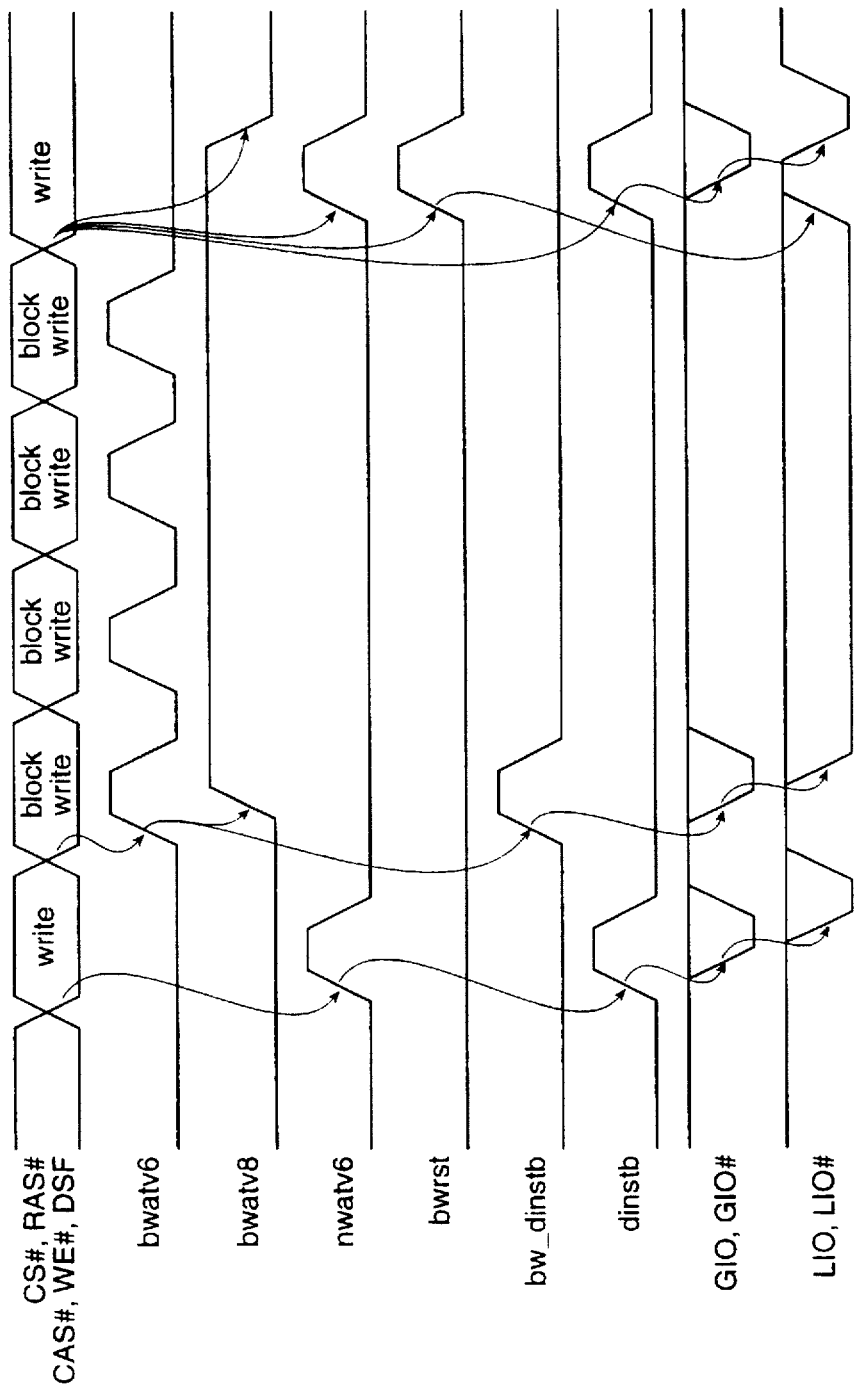
FIG. 9 is a timing diagram reflecting timing of various signals used in the front end of FIG. 2 when operated in accordance with a first embodiment.

Operation of an embodiment of the present invention is shown in the timing diagram of FIG. 9. Specifically, the timing diagram of FIG. 9 depicts an operation sequence where a first write cycle is followed by four block write cycles. During the block write cycles, the global and local I/O lines are frozen. Upon receipt of the next non-block write cycle (here, a write cycle), a block write reset signal bwrst is generated, a data in strobe (dinstb) is generated, and the global and local I/O lines are unfrozen.

The above description assumed that a particular I/O under consideration was enabled for all write and block write operations. However, the invention is not limiting in this sense. In fact, the logic within the block write reset circuit 108 (FIG. 8) and the local write driver circuit 120 (FIG. 5) is designed to unconditionally reset the local I/O lines LIO, LIO# to their equilibrated state and to re-enable pulsing on GIO, GIO# whenever a specific I/O becomes disabled, regardless if such an event occurs during successive block write cycles. A typical case is illustrated in the timing diagram of FIG. 10. A write cycle and then two block write cycles are executed with I/O enable signal dqm asserted low (dqm=0, indicating enabling of the I/O according to some byte or but select signal as is common in wide, e.g., ×16 or ×32, memory devices or devices having other forms of I/O mask control). Operation during these cycles is described above. On the third block write cycle, dqm is negated (high). Referring to block write circuit 108 (FIG. 8), input signal dqm_d0 goes high, setting D flip-flop 144 when node clk pulses high. Node clk is enabled by bwatv8=1 and pulses one gate delay after clkt4 pulses. I/O reset signal bwrst thus goes high. Resetting of the local I/O lines LIO, LIO# and re-enabling of the global I/O lines GIO, GIO# occur similarly to the operation described above in conjunction with the description of a first cycle other than a block write or NOP cycle, except that master block write enable signal bwatv8 does not reset. In this way, bwatv8 can be shared with other I/Os which may still be enabled for block write operation, although the invention is not limiting in this sense. A separate bwatv8 signal can alternatively be generated for each specific I/O control signal dqm. Resetting of the local I/O lines LIO, LIO# is required so that no write operation occurs to this I/O, which is deselected.

Figure 10:
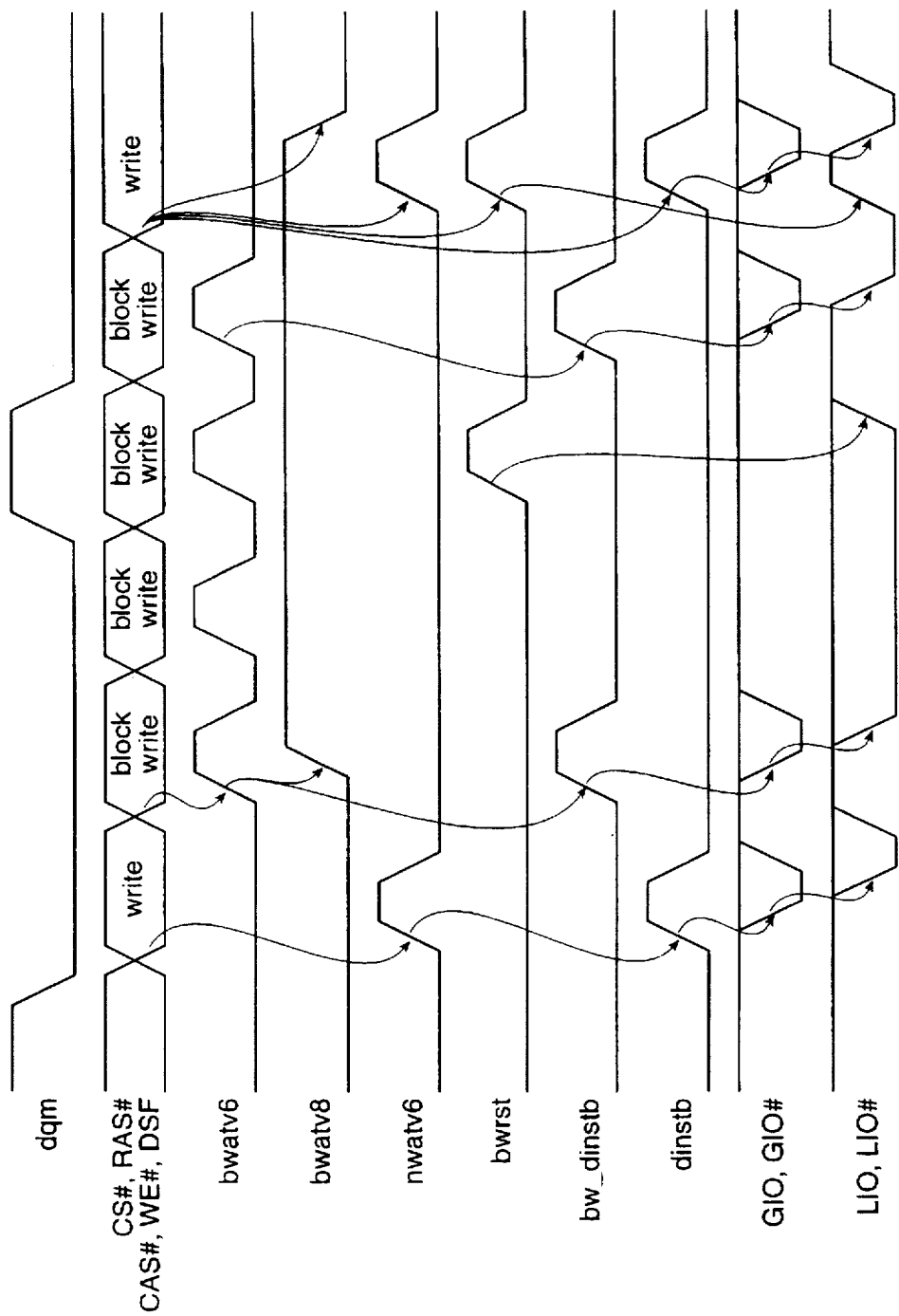
FIG. 10 is a timing diagram reflecting timing of various signals used in the front end of FIG. 2 when operated in accordance with a second embodiment.

FIG. 10 shows that on the fourth block write cycle zero I/O enable control signal dqm is again asserted low. Operation of the circuit for this I/O is similar to that described under the initial block write cycle above. In this way the highly capacitive global and local I/O lines avoid switching during all but the first of several block write cycles unless the I/O is deselected during the block write sequence. If the I/O remains deselected until a cycle other than a block write or NOP occurs, no switching on the global or local I/O lines occurs and no power is dissipated. If the I/O is re-enabled during the sequence of block writes, a new block write strobe signal (bw_dinstb) occurs, and operation relative to control of the global and local I/O lines is similar to that for the first block write cycle.

As will be appreciated by those familiar with the art, the present invention may be embodied in other specific forms without departing from the spirit or essential characteristics thereof. Accordingly, the disclosure of the invention is intended to be illustrative, but not limiting, of the scope of the invention which is set forth in the following claims.

What is claimed is:

1. A video memory device of the type having a normal write mode for writing to a single memory word per write cycle and a block write mode capable of writing to multiple memory words within a single write cycle, the memory device comprising:

a global write driver driving global input/output (I/O) lines;

a plurality of local write drivers, each driving local I/O lines, each of said local I/O lines coupled to write data to a number of memory cells;

control circuitry, coupled to said global write driver and to said plurality of local write drivers, adapted to generate block write control signals and normal write control signals;

said block write control signals causing said global I/O lines to freeze during a block write cycle and thereby suppress precharging of said global I/O lines as compared to said normal write mode.

2. The video memory device of claim 1, wherein said block write control signals cause at least a selected set of said local I/O lines to remain in a set differential state during said block write cycle.

3. The video memory device of claim 1, further comprising:

at least a first color register, storing color data, coupled to said global write driver, said block write control signals causing said color data to be passed on said global I/O lines.

4. The video memory device of claim 3, wherein said block write control signals cause said color data to be latched into at least a first one of said plurality of local write drivers.

5. The video memory device of claim 1, wherein said block write control signals cause at least a first one of said local write drivers to increase drive on said local I/O lines above drive provided in said normal write mode, wherein a larger number of memory cells can be written to.

6. The video memory device of claim 1, wherein generation of a non-block write control signal results in a reset signal unfreezing said global I/O lines, said normal write control signals also causing data from at least a first data input line to be passed on said global I/O lines.

7. The video memory device of claim 6 wherein said non-block write control signal is a normal write mode signal.

8. The video memory device of claim 1, wherein said memory is a synchronous memory.

9. The video memory device of claim 1 wherein said block write control signals cause said global I/O lines to freeze until the end of said block write cycle.

10. The video memory device of claim 1 wherein each memory word is defined to correspond to one pixel of an image.

11. The video memory device of claim 2 wherein said block write control signals cause said selected set of said local I/O lines to remain in said set differential state until the end of said block write cycle.

12. A method for operating a video memory device having at least a normal write mode for writing to memory cells within a single memory address per write cycle and a block write mode for writing to memory cells within multiple memory addresses within a single write cycle, said video memory device accepting input data from a selected one of at least a first color register and data input lines, the method comprising the steps of:

(a) receiving a signal indicating a first block write cycle;

(b) operating global write driver circuitry to generate signals on global input/output (I/O) lines representing color data stored in said at least first color register;

(c) latching said color data in at least a first local write driver;

(d) preventing said global I/O lines from producing further signals until a signal indicating a cycle other than a block write cycle is received; and (e) operating said at least first local write driver to produce a differential signal on said local I/O lines representing said color data.

13. The method of claim 12, wherein said step (e) includes increasing the drive of said at least first: local write driver to produce signals on said local I/O lines capable of writing said color data to memory cells within a plurality of memory addresses.

14. The method of claim 12, further comprising the steps of:

(f) receiving a signal indicating a subsequent block write cycle;

(g) operating said at least first local write driver to apply said differential signal representing said color data to said local I/O lines.

15. The method of claim 12, further comprising the steps of:

(h) repeating said steps (f) and (g) until local I/O select signal is deasserted.

16. The method of claim 15, further comprising the steps of:

(i) receiving a signal indicating a subsequent block write cycle after said local I/O select signal is deasserted; and (j) repeating said steps (f) and (q) until a signal indicating a cycle other than a block write cycle is received or until said local I/O select signal is deasserted.

17. The method of claim 12, further comprising the steps of:

(k) receiving a signal indicating a cycle other than a block write cycle;

(l) operating said global write driver circuitry to generate signals on said global I/O lines representing data received on said data input lines;

(m) reducing the drive capacity of said at least first local I/O write driver;

(n) operating said at least first local I/O write driver to generate signals on said local I/O lines representing said data received on said data input lines.

18. The method of claim 14, wherein said step (m) includes deasserting at least a first drive transistor.

19. The method of claim 14, wherein said signal indicating a cycle other than a block write cycle is a normal write cycle signal.

20. The method of claim 12 further comprising the step (o) of maintaining said differential signal on said local I/O lines until a signal indicating a cycle other than a block write cycle is received.

21. A memory device of the type having a normal write mode for writing to memory cells within a single memory address per write cycle and a block write mode in which memory cells within multiple memory addresses may be written to within a single write cycle, the memory device comprising:

a write data path including a global write driver coupled to global I/O lines and a plurality of local write drivers coupled to said global I/O lines and to a plurality of local I/O lines;

control circuitry, coupled to said write data path, for providing block write control signals and normal write control signals to said write data path;

said write control signals causing said write data path to freeze during a block write cycle as compared to a normal write cycle.

22. The memory device of claim 17 wherein said control circuitry further provides I/O write control signals, said I/O write control signals selecting a specific local write driver.

23. The memory device of claim 17, wherein said write control signals cause at least a selected one of said local write drivers to increase its drive capacity during a block write cycle.

24. The memory device of claim 17, wherein said write data path is unfrozen by initiation of a cycle other than a block write cycle.

25. The memory device of claim 17, wherein the local write driver portion of said write data path produces a single differential signal until a selected local write driver is deselected.

26. The memory device of claim 21 wherein each address is a memory word address.

27. The memory device of claim 26 wherein each memory word includes at least 16 bits.

28. A memory device of the type having a normal write mode for writing to a single memory word per write cycle and a block write mode in which multiple memory words may be written to within a single write cycle, the memory device comprising:

a global write driver driving global input/output (I/O) lines;

a plurality of local write drivers, each driving local I/O lines, each of said local I/O lines coupled to write data to a number of memory cells;

control circuitry, coupled to said global write driver and to said plurality of local write drivers, adapted to generate block write control signals and normal write control signals;

said block write control signals causing at least one of said plurality of local write drivers to increase the drive on at least a particular one of said local I/O lines above drive provided in said normal write mode, whereby a larger number of memory cells can be written to.

29. The memory device of claim 22 wherein generation of said block write control signals also causes said global I/O lines to freeze during a block write cycle, and causes said local I/O lines to remain in a set differential state during said block write cycle.

30. The memory device of claim 28 wherein memory words each include at least 16 bits.

31. The memory device of claim 28 wherein the memory device is capable of writing to more than two words of memory within a single write cycle in block write mode.

32. A method for operating a memory device having at least a normal write mode for writing to memory cells within a single memory address per write cycle and a block write mode for writing to memory cells within multiple memory addresses within a single write cycle, said memory device accepting input data, the method comprising the steps of:

(a) receiving a signal indicating a first block write cycle;

(b) operating global write driver circuitry to generate signals on global input/output (I/O) lines representing said input data;

(c) latching said signals in at least a first local write driver;

(d) preventing said global I/O lines from producing further signals until a signal indicating a cycle other than a block write cycle is received; and (e) operating said at least first local write driver to produce a differential signal on said local I/O lines representing said input data.

33. The method of claim 32 further comprising the step (o) of maintaining said differential signal on said local I/O lines until a signal indicating a cycle other than a block write cycle is received.

34. The method of claim 32, wherein said step (e) includes increasing the drive of said at least first local write driver to produce signals on said local I/O lines capable of writing said color data to memory cells within a plurality of memory addresses.

35. The method of claim 32 wherein each address is the address of a memory word.

36. The method of claim 32, wherein said signal indicating a cycle other than a block write cycle is a normal write cycle signal.

* * * * *